US009854908B1

(12) United States Patent
Tang

(10) Patent No.: US 9,854,908 B1
(45) Date of Patent: Jan. 2, 2018

(54) MOUNTING MECHANISM AND SLIDING RAILS USING THE SAME

(71) Applicants: HONGFUJIN PRECISION ELECTRONICS (TIANJIN) CO., LTD., Tianjin (CN); HON HAI PRECISION INDUSTRY CO., LTD., New Taipei (TW)

(72) Inventor: Chen-Sheng Tang, New Taipei (TW)

(73) Assignees: HONGFUJIN PRECISION ELECTRONICS (TIANJIN) CO., LTD., Tianjin (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/386,475

(22) Filed: Dec. 21, 2016

(30) Foreign Application Priority Data

Nov. 25, 2016 (CN) .......................... 2016 1 1062198

(51) Int. Cl.
| | |
|---|---|
| *A47B 96/06* | (2006.01) |
| *A47B 88/43* | (2017.01) |
| *A47B 88/407* | (2017.01) |
| *H05K 7/14* | (2006.01) |
| *H05K 7/18* | (2006.01) |

(52) U.S. Cl.
CPC ............ *A47B 88/43* (2017.01); *A47B 88/407* (2017.01); *H05K 7/1489* (2013.01); *H05K 7/183* (2013.01)

(58) Field of Classification Search
CPC ....... A47B 96/07; A47B 96/068; A47B 88/43; A47B 88/493; H05K 7/1489; H05K 7/183; F16L 3/015
USPC ............. 248/220.43; 312/334.47, 333, 330.1
See application file for complete search history.

(56) References Cited

U.S. PATENT DOCUMENTS

| | | | |
|---|---|---|---|
| 9,532,483 B1* | 12/2016 | Chang ........................ F16B 2/12 |
| 2012/0292274 A1* | 11/2012 | Lin ........................ A47B 88/43 |
| | | | 211/86.01 |
| 2016/0286683 A1* | 9/2016 | Chen ..................... H05K 7/1489 |
| 2017/0013959 A1* | 1/2017 | Chen ..................... A47B 96/07 |

* cited by examiner

*Primary Examiner* — Todd M Epps
(74) *Attorney, Agent, or Firm* — ScienBiziP, P.C.

(57) ABSTRACT

A mounting mechanism which can be mounted to holes with different shapes includes an installation member, a locating member, and a clamping member. The locating member includes a first locating pillar with one end fixed to the installation member and a second locating pillar fixed to an opposite end of the first locating pillar. A floating pillar is sheathed on the second locating pillar and one end of the floating pillar is elastically connected to the installation member. The clamping member is opposite to the locating member to form a clamping part together with the locating member. The floating pillar is moveable between a first position, where the floating pillar shields the second locating pillar and a second position where the floating pillar exposes the second locating pillar. A sliding rail is further disclosed.

20 Claims, 5 Drawing Sheets

MOUNTING MECHANISM AND SLIDING RAILS USING THE SAME

FIELD

The subject matter herein generally relates to a mounting mechanism and sliding rails using the mounting mechanism.

BACKGROUND

A plurality of servers can be mounted in a chassis. The servers have sliding rails and the chassis includes installation parts corresponding to the sliding rails. To be specific, each of the rails can include mounting mechanisms on its two opposite ends, the installation parts can be installation holes corresponding to the mounting mechanisms.

As the installation holes can be square hole, circular hole, or screw hole, a mounting mechanism that could mount to holes with different shapes would be beneficial.

BRIEF DESCRIPTION OF THE DRAWINGS

Implementations of the present technology will now be described, by way of example only, with reference to the attached figures.

DETAILED DESCRIPTION

Figure 1:
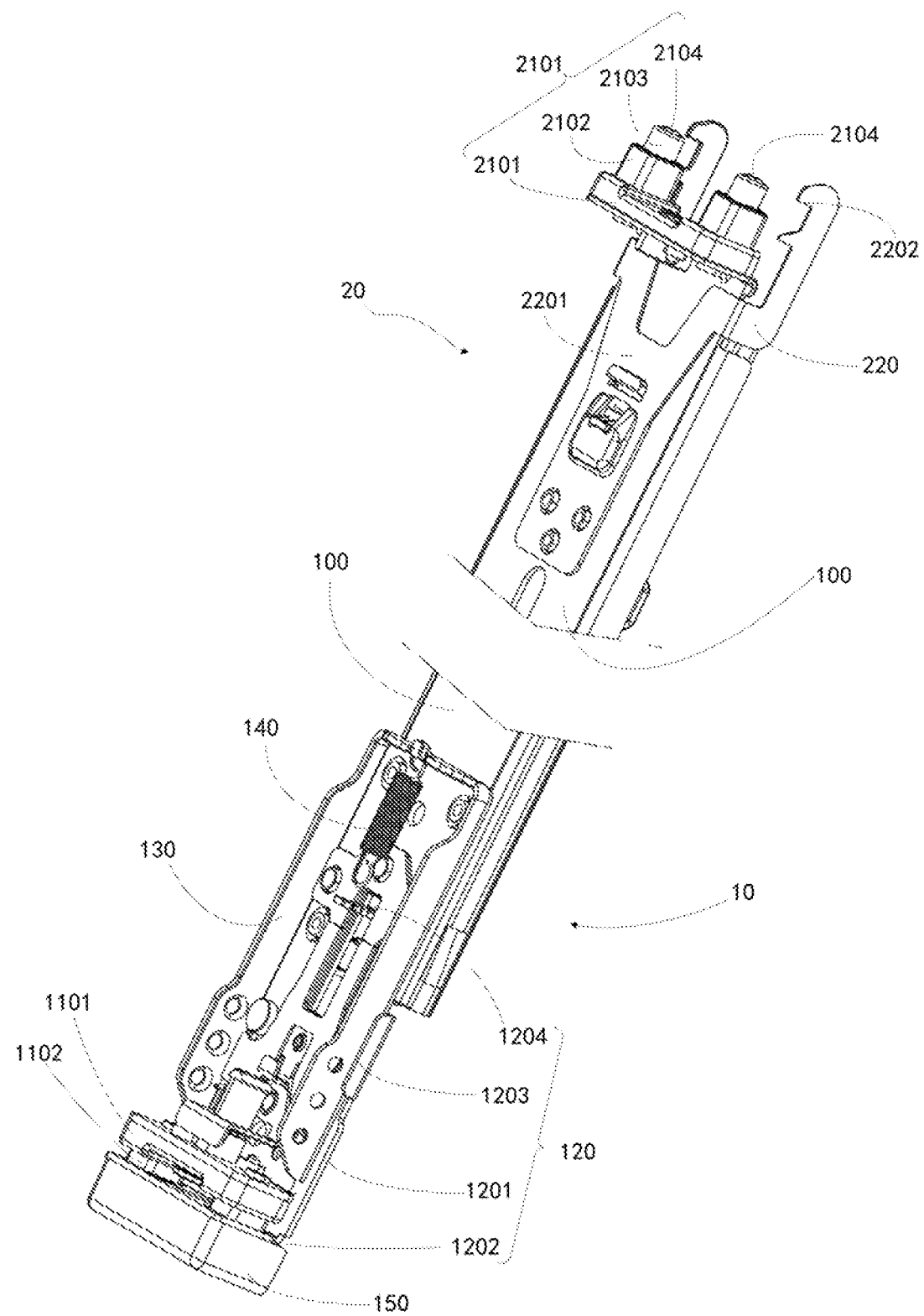
FIG. 1 is an isometric view of an exemplary embodiment of a mounting mechanism.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates a sliding rail (not labeled) in an exemplary embodiment.

The sliding rail can include a sliding bar 100, the sliding bar 100 includes two opposite ends. A first mounting mechanism 10 and a second mounting mechanism 20 are respectively fixed to the two opposite ends of the sliding bar 100. It is understood that each of the two opposite ends of the sliding bar 100 is compatible with the first mounting mechanism 10 or the second mounting mechanism 20. The sliding bar 100 is shown in FIG. 1.

Figure 3:
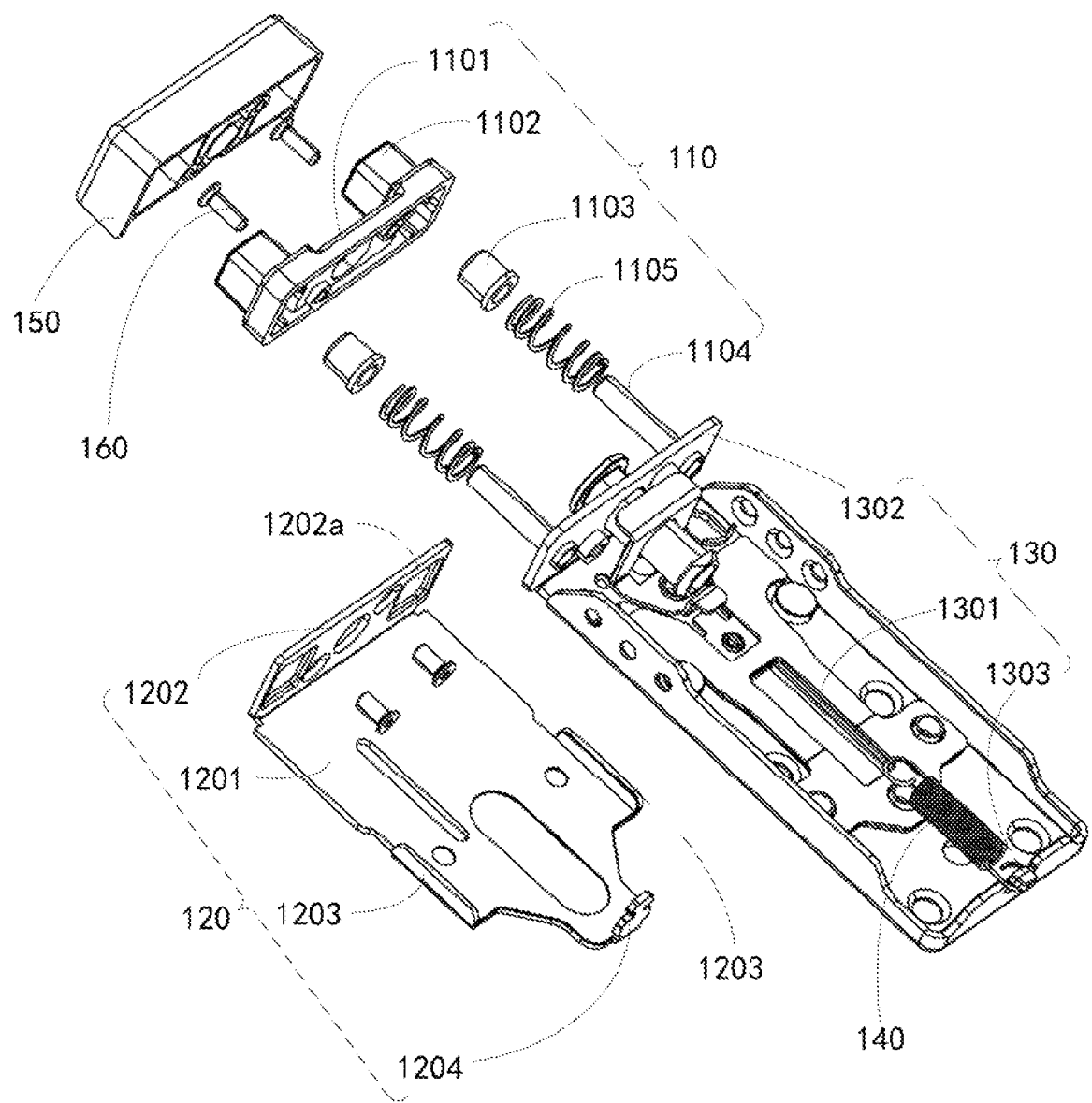
FIG. 3 is an exploded view of the mounting mechanism of FIG. 2.
Figure 4:
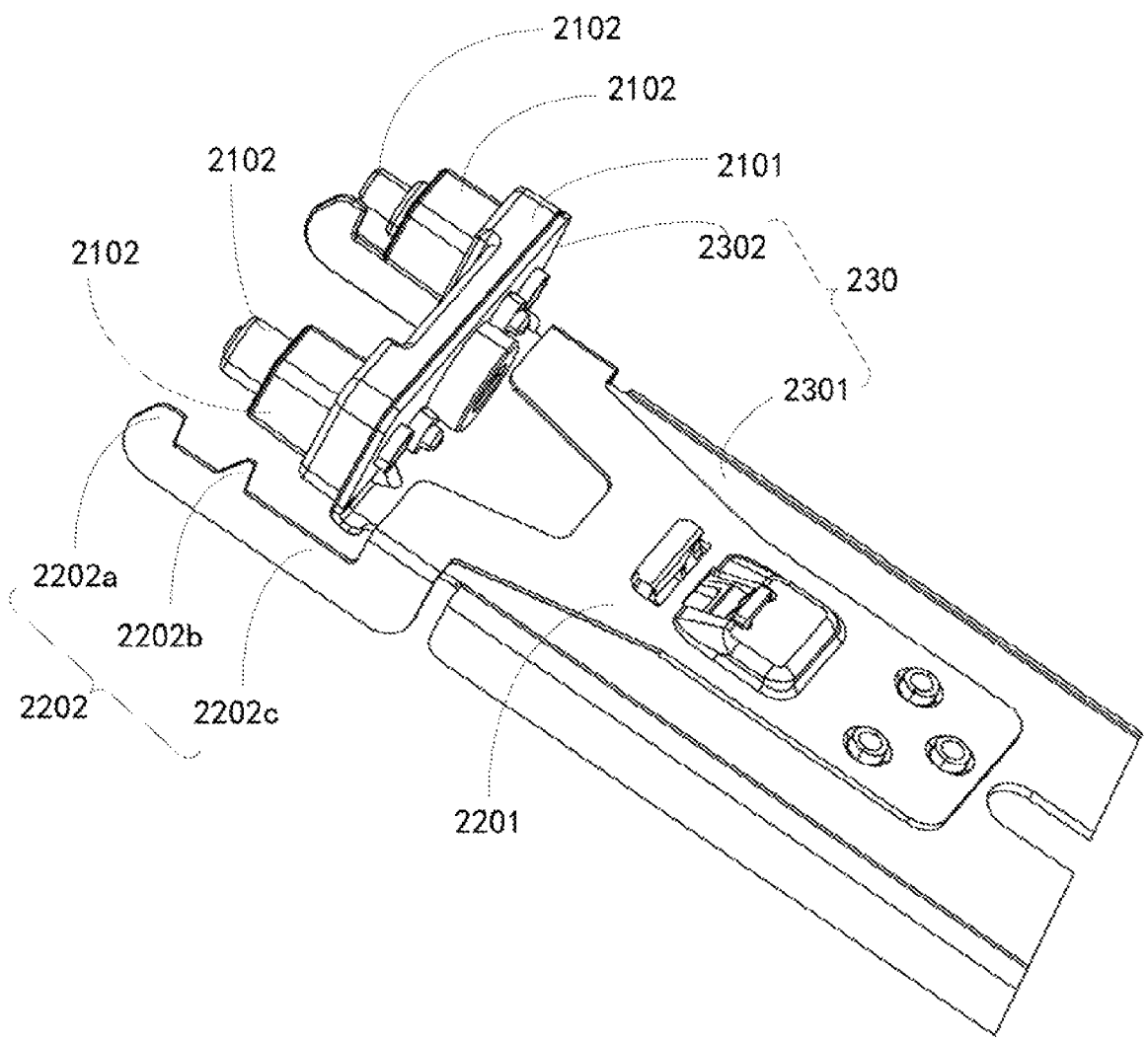
FIG. 4 is an isometric view of a second exemplary embodiment of the mounting mechanism.

Referring to FIG. 3, the first mounting mechanism 10 can include a first locating member 110, a first clamping member 120, and a first installation member 130. The first installation member 130 is used to install the first mounting mechanism 10 to an end of the sliding bar 100.

Figure 2:
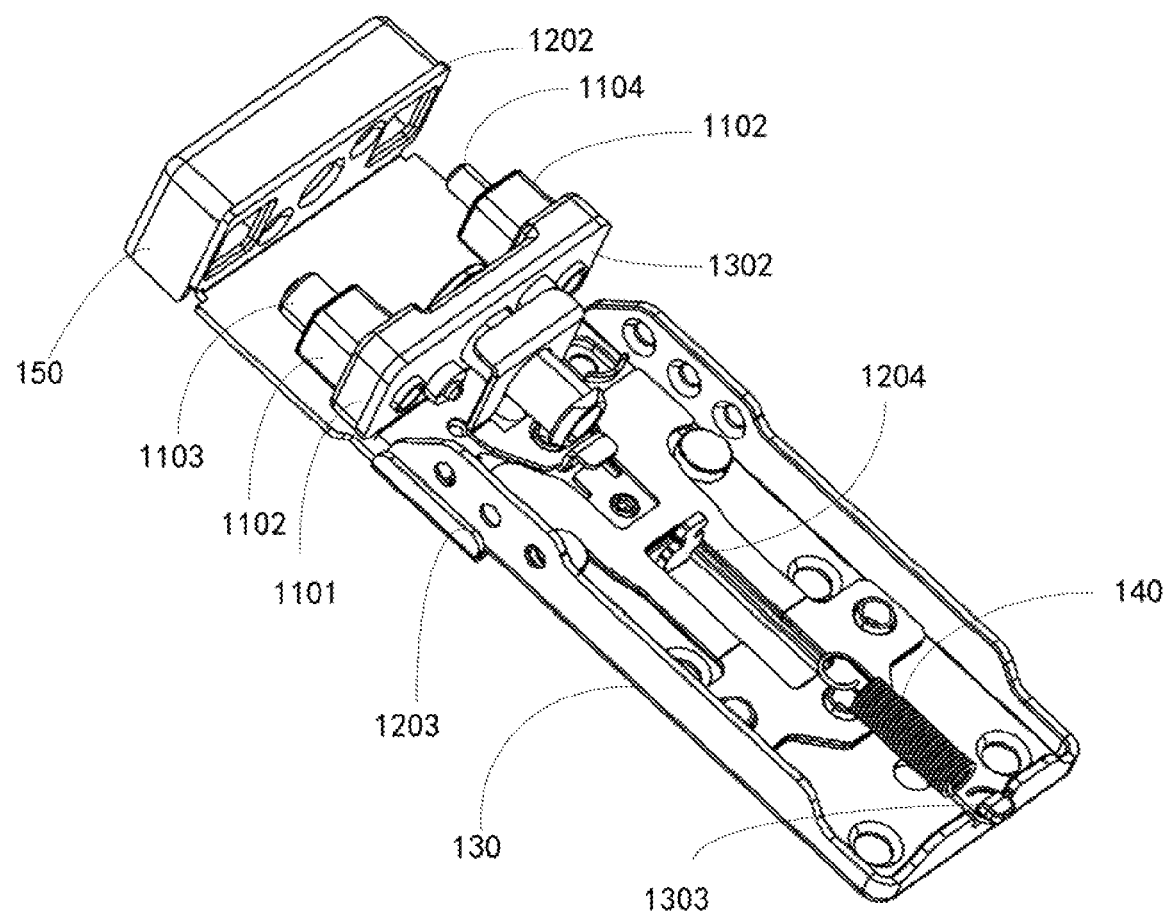
FIG. 2 is an isometric view of the mounting mechanism of FIG. 1.

In FIG. 2, the first locating member 110 can include a first polygon 1102 with one end fixed to the first installation member 130, a first round bar 1104 fixed to an opposite end of the polygon 1102, and a first hollow pin 1103. The first polygon 1102, the first round bar 1104, and first hollow pin 1103 can match with the shape of holes defined on external members such as square holes, with round holes, and with screw holes on external members.

In FIG. 3, the first polygon 1102 defines a through hole (not shown) along its extending direction. One end of the first round bar 1104 traverses the through hole and is fixed to an end of the first installation member 130, an opposite end of the first round bar 1104 protrudes out of the through hole and is sheathed by the first hollow pin 1103. An end of the first hollow pin 1103 resists the first installation member 130 through a first elastic member, such as a first spring 1105. When the first hollow pin 1103 is pressed, the first hollow pin 1103 moves along the first round bar 1104 and is accommodated in the through hole of the first polygon 1102, to expose the first round bar 1104. When the first hollow pin 1103 is not under pressure, the first hollow pin 1103 shields the first round bar 1104.

In at least one exemplary embodiment, the first locating member 110 can further comprise a first base 1101 mounted to the first installation member 130. The first polygon 1102 is fixed to the first base 1101. The first hollow pin 1103 defines a flange (not labeled) on an end adjacent to the first installation member 130. The through hole of the first polygon 1102 is a stepped hole coupled with the first hollow pin 1103 and the flange. The first spring 1105 resists between the flange and the first installation member 130.

The first installation member 130 can include a first bottom plate 1301 and a first side plate 1302 perpendicularly connected to an end of the first bottom plate 1301. The first bottom plate 1301 is used to mount to the sliding bar 100. The first base 1101 and the first polygon 1102 are fixed to the first side plate 1302. The first base 1101 and the first side plate 1302 can define screw holes and then be fastened together by first screws 160.

The first clamping member 120 can include a first connecting plate 1201 connected to the first installation member 130. The first connecting plate 1201 defines a first hook 1202 opposite to the first locating member 110. An end cover 150 can be attached to a peripheral surface of the first hook 1202. The first connecting plate 1201 slidably fits on the first bottom plate 1301, each of two opposite sides of the first connecting plate 1201 defines a folding 1203 on an edge of the first bottom plate 1301.

The first connecting plate 1201 can be elastically connected with the installation member 130 by a tension spring 140. The first connecting plate 1201 defines a first hanger 1204 connected to an end of the tension spring 140, and the first installation member 130 defines a second hanger 1303 connected to an opposite end of the tension spring 140.

An end of the sliding bar 100 can be mounted to an external part (not shown) with mounting holes through the first mounting mechanism 10. The first clamping member 120 can be initially pulled away from the first locating member 110, and the tension spring 140 is thus elastically deformed as shown in FIG. 2. One of the first polygon 1102, the first hollow pin 1103, or the first round bar 1104 can then be inserted into the mounting holes of the external part, and the clamping member 120 can be finally released, so that the clamping member 120 clamps the external part by the restoring force of the tension spring 140.

Figure 5:
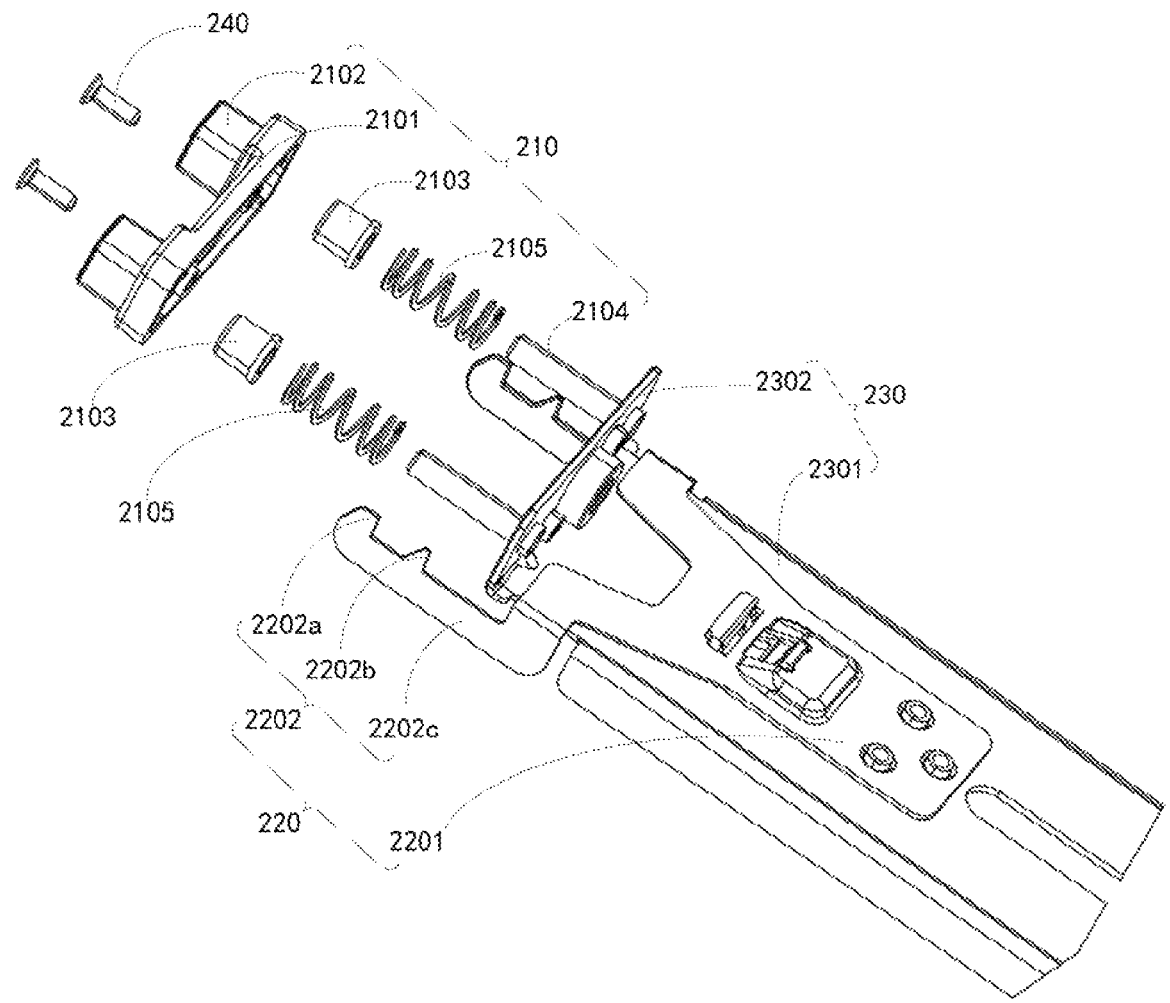
FIG. 5 is an exploded view of the mounting mechanism of FIG. 4.

Referring to FIG. 5, the second mounting mechanism 20 can include a second locating member 210, a second clamping member 220, and a second installation member 230. The second installation member 230 is used to install the second mounting mechanism 20 to an opposite end of the sliding bar 100.

The second locating member 210 can include a second base 2101, a second polygon 2102, a second hollow pin 2103, a second round bar 2104, and a second spring 2105, which can be similarly set as in the first locating member 110. The second installation member 230 can include a second bottom plate 2301 and a second side plate 2302, which can be similarly set as in the first installation member 130.

The second clamping member 220 can include a second connecting plate 2201 connected to the second installation member 230. The second connecting plate 2201 is mounted to the second bottom plate 2301. The second connecting plate 2201 defines a second hook 2202 opposite to the second locating member 210. The second hook 2202 can include a cantilever 2202c extending from the second connecting plate 2201 to the second locating member 210. The cantilever 2202c defines a first tooth 2202b corresponding to the second polygon 2102 and a second tooth 2202a corresponding to the second hollow pin 2103 and the second round bar 2104.

An opposite end of the sliding bar 100 can be mounted to an external part (not shown) with mounting holes through the second mounting mechanism 20. The second polygon 2102 can be inserted into the mounting holes of the external part and then the external part can be clamped by the first tooth 2202b. Similarly, the second hollow pin 2103 and the second round bar 2104 can be inserted into the mounting holes of the external part and then the external part can be clamped by the second tooth 2202a.

The exemplary embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A mounting mechanism comprising:
   an installation member;
   a locating member comprising
      a first locating pillar, the first locating pillar has one end mounted to the installation member;
      a second locating pillar fixed to an opposite end of the first locating pillar; and
      a float pillar sheathed on the second locating pillar, one end of the float pillar is elastically connected to the installation member; and
   a clamping member opposite to the locating member to form a clamping part together with the locating member;
   wherein the float pillar is moveable between a first position, where the float pillar shields the second locating pillar, and a second position, where the float pillar exposes the second locating pillar.

2. The mounting mechanism of claim 1, wherein the locating member further comprises a first elastic member, the first locating pillar is a polygon, the second locating pillar is a round bar, the float pillar is a hollow pin, an end of the second locating pillar resists against the installation member through the first elastic member.

3. The mounting mechanism of claim 2, wherein the first locating pillar defines a through hole along its extending direction, one end of the second locating pillar traverses the through hole and fixed to an end of the installation member, an opposite end of the second locating pillar protrudes out of the through hole and sheathed by the float pillar; when the float pillar moves to the second position, the float pillar is accommodated in the through hole and exposes the other end of the second locating pillar.

4. The mounting mechanism of claim 3, wherein the locating member further comprises a base fixed to the installation member, the first locating pillar is fixed to the base; the float pillar defines a flange on an end adjacent to the installation member; the through hole is a step hole coupled with the float pillar and the flange; the first elastic member abuts between the flange and the installation member.

5. The mounting mechanism of claim 4, wherein the installation member comprises a bottom plate and a side plate perpendicularly connected to an end of the bottom plate, the base and the first locating pillar are fixed to the side plate.

6. The mounting mechanism of claim 1, wherein the clamping member comprises a connecting plate connected to the installation member, the connecting plate defines at least one hook opposite to the locating member.

7. The mounting mechanism of claim 6, wherein the hook comprises a cantilever extending from the connecting plate to the locating member, the cantilever defines a first tooth corresponding to the first locating pillar and a second tooth corresponding to the second locating pillar.

8. The mounting mechanism of claim 6, wherein the mounting mechanism further comprises a second elastic member, the connecting plate is slidably connected to the installation member, the second elastic member is pre-stretched and connected between the connecting plate and the installation member.

9. The mounting mechanism of claim 8, wherein the installation member comprises a bottom plate and a side plate perpendicularly connected to an end of the bottom plate, the connecting plate slidably fits on the bottom plate, each of two opposite sides of the connecting plate defines a folding fitting on a corresponding edge of the bottom plate.

10. The mounting mechanism of claim 8, wherein the second elastic member is a tension spring, the connecting plate defines a first hanger connected to an end of the tension spring, the installation member defines a second hanger connected to an opposite end of the tension spring.

11. A sliding rail comprising:
    a sliding bar; and
    two mounting mechanisms respectively fixed to two opposite ends of the sliding bar, each of the two mounting mechanisms comprises:

an installation member;
a locating member comprising
  a first locating pillar with one end fixed to the installation member;
  a second locating pillar fixed to an opposite end of the first locating pillar; and
  a float pillar sheathed on the second locating pillar, one end of the float pillar is elastically connected to the installation member; and
a clamping member opposite to the locating member to form a clamping part together with the locating member;
wherein the float pillar is moveable between a first position, where the float pillar shield the second locating pillar, and a second position, where the float pillar exposes the second locating pillar.

12. The sliding rail of claim 11, wherein the locating member further comprises a first elastic member, the first locating pillar is a polygon, the second locating pillar is a round bar, the float pillar is a hollow pin, an end of the second locating pillar resists against the installation member through the first elastic member.

13. The sliding rail of claim 12, wherein the first locating pillar defines a through hole along its extending direction, one end of the second locating pillar traverses the through hole and fixed to an end of the installation member, an opposite end of the second locating pillar protrudes out of the through hole and sheathed by the float pillar; when the float pillar moves to the second position, the float pillar is accommodated in the through hole and exposes the other end of the second locating pillar.

14. The sliding rail of claim 13, wherein the locating member further comprises a base fixed to the installation member, the first locating pillar is fixed to the base; the float pillar defines a flange on an end adjacent to the installation member; the through hole is a step hole coupled with the float pillar and the flange; the first elastic member is resisted between the flange and the installation member.

15. The sliding rail of claim 14, wherein the installation member comprises a bottom plate and a side plate perpendicularly connected to an end of the bottom plate, the base and the first locating pillar are fixed to the side plate.

16. The sliding rail of claim 11, wherein the clamping member comprises a connecting plate connected to the installation member, the connecting plate defines at least one hook opposite to the locating member.

17. The sliding rail of claim 16, wherein the hook comprises a cantilever extending from the connecting plate to the locating member, the cantilever defines a first tooth corresponding to the first locating pillar and a second tooth corresponding to the second locating pillar.

18. The sliding rail of claim 16, wherein the sliding rail further comprises a second elastic member, the connecting plate is slidably connected to the installation member, the second elastic member is pre-stretched and connected between the connecting plate and the installation member.

19. The sliding rail of claim 18, wherein the installation member comprises a bottom plate and a side plate perpendicularly connected to an end of the bottom plate, the connecting plate slidably fits on the bottom plate, each of two opposite sides of the connecting plate defines a folding fitting on corresponding edge of the bottom plate.

20. The sliding rail of claim 18, wherein the second elastic member is a tension spring, the connecting plate defines a first hanger connected to an end of the tension spring, the installation member defines a second hanger connected to an opposite end of the tension spring.

* * * * *